(12) United States Patent
Shiroki et al.

(10) Patent No.: US 9,227,851 B2
(45) Date of Patent: *Jan. 5, 2016

(54) BI-SUBSTITUTED RARE EARTH IRON GARNET SINGLE CRYSTAL, METHOD OF MANUFACTURING THE SAME, AND OPTICAL DEVICE

(75) Inventors: Kenichi Shiroki, Tokyo (JP); Takashi Fukuhara, Tokyo (JP); Kenji Narita, Tokyo (JP)

(73) Assignee: NAMIKI SEIMITSU HOUSEKI KABUSHIKI KAISHA, Tokyo (JP)

( * ) Notice: Subject to any disclaimer, the term of this patent is extended or adjusted under 35 U.S.C. 154(b) by 446 days.

This patent is subject to a terminal disclaimer.

(21) Appl. No.: 13/698,921

(22) PCT Filed: May 30, 2011

(86) PCT No.: PCT/JP2011/062326
§ 371 (c)(1),
(2), (4) Date: Nov. 19, 2012

(87) PCT Pub. No.: WO2011/152333
PCT Pub. Date: Dec. 8, 2011

(65) Prior Publication Data
US 2013/0071316 A1    Mar. 21, 2013

(30) Foreign Application Priority Data

May 31, 2010  (JP) ................ 2010-124319

(51) Int. Cl.
| | |
|---|---|
| *F21V 9/00* | (2015.01) |
| *G02B 5/02* | (2006.01) |
| *G02C 7/10* | (2006.01) |
| *G02F 1/361* | (2006.01) |
| *G03B 11/00* | (2006.01) |
| *C01G 49/02* | (2006.01) |
| *C01G 49/00* | (2006.01) |
| *C30B 19/02* | (2006.01) |
| *C30B 29/28* | (2006.01) |
| *H01F 10/24* | (2006.01) |
| *G11B 5/66* | (2006.01) |
| *G02F 1/09* | (2006.01) |

(52) U.S. Cl.
CPC ............. *C01G 49/02* (2013.01); *C01G 49/0018* (2013.01); *C01G 49/0054* (2013.01); *C30B 19/02* (2013.01); *C30B 29/28* (2013.01); *H01F 10/24* (2013.01); *C01P 2002/52* (2013.01); *C01P 2002/54* (2013.01); *G02F 1/09* (2013.01)

(58) Field of Classification Search
USPC ...................... 117/64, 66; 252/582; 398/207; 423/594.1, 594.7; 428/822.2
See application file for complete search history.

(56) References Cited

U.S. PATENT DOCUMENTS

2003/0219261 A1    11/2003  Ohido et al.
2014/0021418 A1 *  1/2014   Shiroki et al. ................. 252/582

FOREIGN PATENT DOCUMENTS

| JP | 62-186505   | A |   | 8/1987  |              |
|----|-------------|---|---|---------|--------------|
| JP | 2004-083390 | A |   | 3/2004  |              |
| JP | 2006-169093 | A |   | 6/2006  |              |
| JP | 2007-153696 | A |   | 6/2007  |              |
| JP | 2009-091214 | A |   | 4/2009  |              |
| JP | 2011-011945 |   | * | 1/2011  | ............. C30B 29/28 |
| JP | 2011-011945 | A |   | 1/2011  |              |
| JP | 2011-016679 |   | * | 1/2011  | ............. C30B 29/28 |
| JP | 2011-016679 | A |   | 1/2011  |              |

OTHER PUBLICATIONS

International Search Report; PCT/JP2011/062326; Aug. 9, 2011.

* cited by examiner

*Primary Examiner* — Bijan Ahvazi
(74) *Attorney, Agent, or Firm* — Studebaker & Brackett PC

(57) ABSTRACT

Provided is a Bi-substituted rare earth iron garnet single crystal which has a composition of $R_{3-x}Bi_xFe_{5-w}A_wO_{12}$, wherein R denotes one or more rare earth elements among Y, Eu, Gd, Ho, Yb, Lu, Nd, Tm, La, Sm, Dy, Er, Ce, and Pr while definitely including Gd, A denotes one or more elements among Ga, Al, In, Sc, Co, Ni, Cr, V, Ti, Si, Ge, Mg, Zn, Nb, Ta, Sn, Zr, Hf, Pt, Rh, Te, Os, Ce, and Lu, $0.7 < x \leq 1.5$, and $0 < w \leq 1.5$, does not contain Pb and contains Pt, and additionally contains M which denotes Mn or at least one Group 2 element, wherein a coefficient $\alpha$ is set to any value within a numerical range of $0.815 \pm 0.035$ and $\Delta$ (which means ($\alpha \times$ [M])−[Pt]) is set from −0.40 atppm to 3.18 atppm.

8 Claims, No Drawings

BI-SUBSTITUTED RARE EARTH IRON GARNET SINGLE CRYSTAL, METHOD OF MANUFACTURING THE SAME, AND OPTICAL DEVICE

TECHNICAL FIELD

The present invention relates to a lead-free Bi-substituted rare earth iron garnet single crystal, a method of manufacturing the same, and an optical device including the Bi-substituted rare earth iron garnet single crystal.

BACKGROUND ART

A Faraday rotor used in an optical isolator, an optical circulator, or the like uses a Bi-substituted rare earth iron garnet single crystal (hereinafter, referred to as a "garnet single crystal" as occasion demands) that is grown according to a liquid phase epitaxy (LPE) method. The LPE method is a method of growing a single crystal, wherein a melt is prepared by putting a material in a crucible and melting the material and a garnet single crystal is epitaxial-grown by contacting a growing substrate with the melt. Since PbO is used in the melt along with $B_2O_3$, $Bi_2O_3$, or the like, Pb (lead) contained in the grown garnet single crystal is unavoidable.

Recently, in order to prevent an adverse effect of a highly harmful chemical material on the environment, there have been movements to restrict harmful material from being included in a product worldwide, and lead is also designated as a harmful material. An example of a restriction on harmful materials includes Restriction of Hazardous Substances (RoHS) enforced by the European Union (EU). Moreover, even a small amount of lead included in a garnet single crystal may cause environmental contamination, and this has been a problem.

Thus, in order to remove lead included in a garnet single crystal, it is required to grow a garnet single crystal from a melt that does not include lead. Specifically, in a garnet single crystal included in an optical isolator, a thickness for rotating a plane of polarization of light to about 45° was required for optical communication in a wavelength from about 1.3 μm to about 1.6 μm based on a relationship of a Faraday's rotation angle.

Also, along with such a predetermined thickness, it is important to reduce an insertion loss (hereinafter, referred to as "IL"), which is obtained by converting into the thickness generating the Faraday's rotation angle of 45°, to 0.10 dB or lower, which is a market demand for an optical isolator. When a garnet single crystal is grown from a conventional lead-containing melt, platinum (Pt) is used in a crucible for melting a material considering heat resistance and corrosion resistance. Here, when the garnet single crystal is grown in an atmosphere, platinum that is a crucible material is oxidized and dissolved in the melt, and a small amount of platinum is also included in the grown garnet single crystal as quadrivalent platinum ions ($Pt^{4+}$).

Then, it is assumed that bivalent lead ions ($Pb^{2+}$) and quadrivalent platinum ions ($Pt^{4+}$) included in the garnet single crystal generate optical absorption, and bivalent or quadrivalent iron ions ($Fe^{2+}$ or $Fe^{4+}$) induced by the bivalent lead ions and quadrivalent platinum ions increase optical absorption in a wavelength band from 1.3 μm to 1.6 μm, thereby increasing IL.

Since the garnet single crystal is stable in trivalence, charge compensation is performed by using quadrivalent additives when bivalent impurities are excessive, and charge compensation is performed by using bivalent additives when quadrivalent impurities are excessive. It is thought that since the conventional garnet single crystal contains Pb, the Pb exists in the garnet single crystal as bivalent ions ($Pb^{2+}$) and quadrivalent ions ($Pb^{4+}$), and thus a contained balance of the bivalent ions ($Pb^{2+}$) and the quadrivalent ions ($Pt^{4+}$ and $Pb^{4+}$) in the entire garnet single crystal is almost equally maintained. As a result, the generation of $Fe^{2+}$ or $Fe^{4+}$, which increases optical absorption, is low in the conventional garnet single crystal, and thus it is thought that IL is suppressed from being increased (assuming that $Pb^{2+}$ content>$Pb^{4+}$ content).

However, since a melt that does not include lead does not contain $Pb^{2+}$ and $Pb^{4+}$ at all, $Pt^{4+}$ is relatively excessive in a garnet single crystal grown from the melt. Accordingly, $Fe^{2+}$ ions, which are bivalent ions, are generated to perform charge compensation on the excessive $Pt^{4+}$, and thus optical absorption is increased, thereby increasing IL.

Accordingly, a method of using gold (Au), instead of platinum, as a crucible material while growing a garnet single crystal from a melt that does not include lead has been suggested. For example, Patent Reference 1 suggests adding an alkali metal such as Na, instead of Pb, as a melt component that does not include lead.

Also, a technology of suppressing an increase in IL by adding Ca that is bivalent like $Pb^{2+}$, instead of $Pb^{2+}$, has been suggested (for example, refer to Patent Reference 2).

PRIOR ART REFERENCE

Patent Reference (Patent Reference 1) Japanese Laid-Open Patent Publication No. 2006-169093 (pages 5-9)

(Patent Reference 2) Japanese Laid-Open Patent Publication No. 2007-153696 (pages 3-7)

DISCLOSURE OF THE INVENTION

Technical Problem

However, in a garnet single crystal grown according to a manufacturing method disclosed in Patent Reference 1, IL of a Faraday rotor may increase according to a is content of Na. Also, in Patent Reference 1, since gold is mainly used as a material for a crucible or a stirring jig, $Pt^{4+}$ is not included in the garnet single crystal and optical absorption by $Pt^{4+}$ is not generated, but a platinum material needs to be used in an LPE method in terms of heat resistance and mechanical strength. Also, Patent Reference 1 discloses the manufacturing method where Na is added by using NaOH, but due to concerns of burns or blindness, it is difficult to handle NaOH.

Also, in a manufacturing method disclosed in Patent Reference 2, since crystal growing conditions are changed when even a small amount of Ca is included in a $Bi_2O_3$—$B_2O_3$ solvent, thereby deteriorating a growth speed of crystals, which is important in mass productivity, it was difficult to manufacture a garnet single crystal that does not include lead at all as a mass production base. Also, a quality of a garnet single crystal may be deteriorated or IL may be increased according to a content of Ca.

Based on such a technical problem, the present invention provides a garnet single crystal that does not contain lead while using a crucible formed of a platinum material, does not have quality deterioration and has high mass productivity, and enables IL to be less than or equal to 0.10 dB.

Technical Solution

Fundamental concepts of the present invention are to input Mn or at least one Group 2 element that is bivalence such as Pb so as to perform charge compensation with $Pt^{4+}$ that is excessive due to no lead in a melt, and to reduce IL, obtain mass productivity, and promote quality improvement based on a relationship between an IL value of a garnet single crystal including Gd without lead and a difference between Pt concentration and concentration of Mn or at least one Group 2 element (Be, Mg, Ca, Sr, Ba, and Ra) included in the garnet single crystal.

According to an aspect of the present invention, there is provided a Bi-substituted rare earth iron garnet single crystal which has a composition of $R_{3-x}Bi_xFe_{5-w}A_wO_{12}$, wherein R denotes one or more types of rare earth elements selected from a group consisting of Y, Eu, Gd, Ho, Yb, Lu, Nd, Tm, La, Sm, Dy, Er, Ce, and Pr while definitely including Gd, A denotes one or more types of elements selected from a group consisting of Ga, Al, In, Sc, Co, Ni, Cr, V, Ti, Si, Ge, Mg, Zn, Nb, Ta, Sn, Zr, Hf, Pt, Rh, Te, Os, Ce, and Lu, $0.7 < x \leq 1.5$, and $0 < w \leq 1.5$, does not contain Pb and contains Pt, and additionally contains Mn or at least one Group 2 element, wherein, is when M denotes Mn or at least one Group 2 element, [M] denotes M concentration (atppm) and [Pt] denotes Pt concentration (atppm) in the Bi-substituted rare earth iron garnet single crystal, and a relational expression Δ of [M] and [Pt] is represented by Equation 1 below:

$$\Delta = (\alpha \times [M]) - [Pt],\quad\text{[Equation 1]}$$

wherein a coefficient α is set to any value within a numerical range of 0.815±0.035 and Δ is set from −0.40 atppm to 3.18 atppm.

Also, according to an embodiment of the Bi-substituted rare earth iron garnet single crystal of the present invention, Δ may be set from −0.20 atppm to 1.21 atppm.

Also, according to another embodiment of the Bi-substituted rare earth iron garnet single crystal of the present invention, Δ may be set to 0 atppm.

According to another aspect of the present invention, there is provided an optical isolator, an optical circulator, an optical attenuator, a Faraday mirror, a current sensor, a magnetic field sensor, and a magnetic optical switch including the Bi-substituted rare earth iron garnet single crystal.

According to another aspect of the present invention, there is provided a method of manufacturing a Bi-substituted rare earth iron garnet single crystal, the method including: putting a solvent which does include at least $Bi_2O_3$ and does not include a lead compound, and does include $Fe_2O_3$, $Gd_2O_3$, and a solute aside from $Fe_2O_3$ and $Gd_2O_3$ into a crucible formed of a Pt material; putting a mixture of any one of MO, $MO_2$, and $M_2O_3$, wherein M denotes Mn or at least one Group 2 element, into the solvent; and growing a Bi-substituted rare earth iron garnet single crystal on a nonmagnetic garnet crystal substrate, wherein, in the Bi-substituted rare earth iron garnet single crystal, when [M] denotes M concentration (atppm) and [Pt] denotes Pt concentration (atppm) in the Bi-substituted rare earth iron garnet single crystal, and a relational expression Δ of [M] and [Pt] is represented by Equation 2 below:

$$\Delta = (\alpha \times [M]) - [Pt],\quad\text{[Equation 2]}$$

wherein a coefficient α is set to any value within a numerical range of 0.815±0.035 and Δ is set from −0.40 atppm to 3.18 atppm.

Also, according to an embodiment of the method of the present invention, Δ may be set from −0.20 atppm to 1.21 atppm.

Also, according to another embodiment of the method of the present invention, Δ may be set to 0 atppm.

Also, according to another embodiment of the method of the present invention, the Bi-substituted rare earth iron garnet single crystal may be grown under an inert gas atmosphere.

Advantageous Effects

A Bi-substituted rare earth iron garnet single crystal according to the present invention does not adversely affect the environment since lead is not included in a crystal. Also, by manufacturing a Bi-substituted rare earth iron garnet single crystal of claim 1 by using a method of claim 4, the Bi-substituted rare earth iron garnet single crystal contains Mn or at least one Group 2 element while optical Mn or Group 2 element concentration with respect to Pt concentration is set to a Δ value from −0.40 atppm to 3.18 atppm. Accordingly, a generation of $Fe^{2+}$ (and $Fe^{4+}$) in the Bi-substituted rare earth iron garnet single crystal including Gd is suppressed, and thus it is possible to reduce optical absorption and maintain IL to be less than or equal to 0.10 dB in a wavelength of light from about 1.3 μm to about 1.6 μm. Also, by maintaining the Pt concentration to be less than or equal to the Mn or Group 2 element concentration, a steep increase of IL in the wavelength of light from about 1.3 μm to about 1.6 μm may be suppressed.

Also, by manufacturing a Bi-substituted rare earth iron garnet single crystal of claim 2 by using a method of claim 5 and setting a Δ value to be from −0.20 atppm to 1.21 atppm, it is possible to reduce optical absorption by suppressing generation of $Fe^{2+}$ (and $Fe^{4+}$) in the Bi-substituted rare earth iron garnet single crystal including Gd and maintain IL to be less than or equal to 0.05 dB in a wavelength of light from about 1.3 μm to about 1.6 μm. In addition, by maintaining the Pt concentration to be less than or equal to the Mn or Group 2 element concentration, a steep increase of IL in the wavelength of light from about 1.3 μm to about 1.6 μm may be suppressed.

Also, by manufacturing a Bi-substituted rare earth iron garnet single crystal of claim 3 by using a method of claim 6 and setting Pt concentration and Mn or Group 2 element concentration such that a Δ value is 0 atppm, it is possible to reduce optical absorption by suppressing generation of $Fe^{2+}$ (and $Fe^{4+}$) in the garnet single crystal including Gd and set IL to a minimum value in a wavelength of light from about 1.3 μm to about 1.6 μm.

Also, according to a method of manufacturing a Bi-substituted rare earth iron garnet single crystal of claim 7, since an inert gas is used for a growing atmosphere, an increase of $Pt^{4+}$ is prevented as oxidation of Pt in a melt is suppressed during each method described above, and it is possible to suppress generation of $Fe^{2+}$ (and Fe).

Also, according to each optical device of claim 8, the optical device does not adversely affect the environment by including the Bi-substituted rare earth iron garnet single crystal of any one of claims 1 through 3, since the Bi-substituted rare earth iron garnet single crystal included in each optical device does not include lead.

BEST MODE FOR CARRYING OUT THE INVENTION $Pt^{4+}$ from platinum that is a crucible material may be contained in a melt as described above, as quadrivalent ions. Also, accompanied by no lead in a Bi-substituted rare earth iron garnet single crystal (hereinafter, simply referred to as "garnet single crystal" as occasion demands), $Pt^{4+}$ is relatively excessive if there is no $Pb^{2+}$ and $Pb^{4+}$ at all. As a result, it is thought that $Fe^{2+}$ is generated to generate optical absorption, and thus IL is increased. Thus, the inventors added $Mn^{2+}$ as other bivalent ions, instead of $Pb^{2+}$, so as to promote a contained balance of excessive $Pt^{4+}$ and bivalent ions in the garnet single crystal, and made a close study to reduce IL by suppressing generation of $Fe^{2+}$ (and $Fe^{4+}$) while maintaining the contained balance.

Consequently, the inventors completed the present invention by discovering a relationship of an IL value of the garnet single crystal with respect to a concentration difference between Pt concentration and concentration of Mn or at least one Group 2 element (Be, Mg, Ca, Sr, Ba, and Ra), which is put into the garnet single crystal.

Hereinafter, embodiments of the present invention will be described. A garnet single crystal of the present invention is grown by using an LPE method, uses $B(B_2O_3)$ or $Bi(Bi_2O_3)$ as a solvent while using $Bi(Bi_2O_3)$, $Gd(Gd_2O_3)$, $Ho(Ho_2O_3)$, $Fe(Fe_2O_3)$, $Ga(Ga_2O_3)$, or $Al(Al_2O_3)$ as a garnet component that is a solute. Here, a lead compound (PbO or $PbF_2$) is not used as a solvent.

The garnet single crystal according to the present invention is represented by an empirical formula of $R_{3-x}Bi_xFe_{5-w}A_wO_{12}$. Bi is an important component of the garnet single crystal and operates both as a solvent and a solute. Also, an oxide of any one of various rare earth elements, $Fe_2O_3$, and an oxide of an element substitutable with Fe is used as a main solute (garnet component). A rare-earth element R in the present application may be one or more types of elements selected from a group consisting of Y, Eu, Gd, Ho, Yb, Lu, Nd, Tm, La, Sm, Dy, Er, Ce, and Pr, which are independently stable and are capable of preparing the garnet single crystal with Fe. Here, Gd is selected and included without fail. Also, an element A substitutable with Fe may be one or more types of elements selected from a group consisting of Ga, Al, In, Sc, Co, Ni, Cr, V, Ti, Si, Ge, Mg, Zn, Nb, Ta, Sn, Zr, Hf, Pt, Rh, Te, Os, Ce, and Lu.

Also, not to include Pb at all, bivalent Mn ions ($Mn^{2+}$) are added to the solvent in a suitable amount instead of $Pb^{2+}$. By adding the suitable amount of bivalent Mn ions ($Mn^{2+}$), $Mn^{2+}$ and $Pt^{4+}$ are charge-compensated with each other to maintain an ion balance in the garnet single crystal and to prevent generation of optical absorption generated as $Fe^{3+}$ is changed to $Fe^{2+}$ or $Fe^{4+}$, thereby suppressing IL.

Since other bivalent ions exist as well as $Mn^{2+}$ and are substituted for component ions of the garnet single crystal, the other bivalent ions may be bivalent ions having an ionic radius close to the component ions. The garnet single crystal is grown by injecting CaO, MgO, MnO, $MnO_2$, $Mn_2O_3$, or the like as an oxide generating ions into a material. Alternatively, any one of Group 2 elements may be used.

A Bi content in the garnet single crystal affects a Faraday rotation coefficient, and thus a Faraday rotation coefficient increases as a Bi content increases. However, when the Bi content exceeds 1.5 in the empirical formula, the Bi content is unable to match a lattice constant with a growing substrate, and thus a crystal may be defected or crack. When the Bi content is less than or equal to 0.7, a Faraday effect is decreased, and thus a sufficient Faraday rotation coefficient (deg/cm) is not obtained and a thickness of the garnet single crystal required for 45° rotation in a wavelength of 1.5 μm exceeds 500 μm. An increase of the thickness is not suitable since a growing time of the garnet single crystal may increase and a crystal may be defected or crack. In this regard, a Bi content x in the empirical formula is in a range of $0.7 < x \le 1.5$.

As Fe is substituted by Ga, Al, In, or the like, the Faraday rotation coefficient (deg/cm) is decreased and the thickness required for 45° rotation is increased. An Fe substitution amount in the empirical formula is $0 < w \le 1.5$.

Next, an example of a method of manufacturing a garnet single crystal according to the present invention will now be described, but the method is not limited thereto.

First, a crucible formed of a Pt material is prepared, and oxide powder of elements of a solvent and a solute (garnet component) are put into the crucible. Boron oxide ($B_2O_3$) as the solvent, and powder of each of gadolinium oxide ($Gd_2O_3$), bismuth oxide ($Bi_2O_3$), holmium oxide ($Ho_2O_3$), gallium oxide ($Ga_2O_3$), alumina ($Al_2O_3$), and iron oxide ($Fe_2O_3$) of a garnet material component (solute), as an example of a metal oxide forming an epitaxial film of the garnet single crystal, are mixed, put into the platinum crucible, heated, and melted. In addition, powder of any one of MO, $MO_2$, and $M_2O_3$ is mixed as an additive of the solvent. Here, M denotes Mn or at least one Group 2 element. A composition of a melt may vary. Here in the present invention, a lead compound (lead oxide (PbO) or the like) used as a conventional solvent is not input.

Next, the crucible is heated up to 1000 to 1200° C. to melt the powder of each of the solvent and the solute during sufficient stirring, and the melt is uniformly mixed and then a temperature of the melt is decreased to 700 to 950° C. so that the melt is in a supercooled state. A nonmagnetic garnet crystal substrate (hereinafter, referred to as an SGGG substrate) of a surface orientation {111} having a diameter of 76 to 85 mm, a thickness of 0.5 mm, a lattice constant from 12.475 to 12.515 Å, and a composition of $(GdCa)_3(GaMgZr)_5O_{12}$ or $Nd_3Ga_5O_{12}$ was contacted on a liquid surface of the melt during rotation, and the garnet single crystal was grown on the {111} surface via an LPE method at about 810° C. under an inert gas atmosphere. A growth speed was about 0.2 μm/min or more. An inert gas may be, for example, a Group 18 element, nitrogen, or the like.

The inert gas is used in the growth atmosphere to prevent an increase of $Pt^{4+}$ by suppressing oxidation of Pt in the melt and to suppress generation of $Fe^{2+}$ (and Fe). Accordingly, the inert gas is not limited as long as it is an inert gas atmosphere suppressing Pt from being oxidized in the melt.

Under such an atmosphere, the garnet single crystal is grown up to a predetermined thickness (for example, about 500 μm). Also, a crystal lattice constant of the grown garnet single crystal was 12.488 Å dependent upon the lattice constant of the SGGG substrate. The SGGG substrate was removed from the garnet single crystal having such a lattice constant and having a composition represented by $(GdHoBi)_3(FeGaAl)_5O_{12}$, and the garnet single crystal was polished to a thickness in a range from 232 μm to 390 μm. Then, an antireflection film was deposited on both surfaces of the garnet single crystal, and IL characteristics were evaluated.

Upon evaluating a plurality of garnet single crystals, the inventors derived that a difference between Pt concentration and concentration of Mn or at least one Group 2 element contained in the garnet single crystal grown from the melt obtained by mixing the powder of any one of MO, $MO_2$, and $M_2O_3$ with the solvent can be used as a parameter for setting an IL value of the garnet single crystal to a desired value, by relating the difference according to Equation 3 below:

$$\Delta = (\alpha \times [M]) - [Pt] \quad \text{[Equation 3]}$$

In Equation 3, [M] denotes M concentration (atppm) in the garnet single crystal, and [Pt] denotes Pt concentration (atppm) in the garnet single crystal. Also, as described above, M denotes Mn or at least one Group 2 element.

A coefficient α in Equation 3 is set to be any value in a numerical range of 0.815±0.035. In other words, the coefficient α is set to be any value in a numerical range from 0.780 to 0.850. In the present invention, a reason for setting a variation range of ±0.035 is as follows. When a Bi-substituted rare earth iron garnet single crystal is analyzed via a desired analysis method, such as an ICP-MS analysis method, a value of the coefficient α deviates due to analysis precision of the analysis method. Thus, considering the deviation, the variation range of ±0.035 is set.

In the garnet single crystal including Gd according to the present invention, optimum Mn or Group 2 element concentration with respect to Pt concentration is set to a Δ value from −0.40 atppm to 3.18 atppm, and thus optical absorption is reduced by suppressing generation of $Fe^{2+}$ (and $Fe^{4+}$) in the garnet single crystal including Gd and it is possible to set IL in the wavelength of light in a range of 1.3 μm to 1.6 μm to be less than or equal to 0.10 dB. Also, by setting the Pt concentration to be less than or equal to the Mn or Group 2 element concentration, a steep increase of IL in the wavelength of light in the range from 1.3 μm to 1.6 μm may be suppressed.

When the coefficient α is set to any value in the range of 0.815±0.035 (that is from 0.780 to 0.850), the Δ value may be set from −0.40 atppm to 3.18 atppm. In other words, the Bi-substituted rare earth iron garnet single crystal where the Δ value is set from −0.40 atppm to 3.18 atppm when the coefficient α has any one value in the numerical range of 0.815±0.035 is the Bi-substituted rare earth iron garnet single crystal according to the present invention. Also, in the Bi-substituted rare earth iron garnet single crystal having the Δ value from −0.40 atppm to 3.18 atppm, a most preferable Bi-substituted rare earth iron garnet single crystal is a Bi-substituted rare earth iron garnet single crystal that always has the Δ value from −0.40 atppm to 3.18 atppm even when the coefficient α is set to any value within the numerical range of 0.815±0.035 (that is, from 0.780 to 0.850).

Also, more preferably, the Δ value is set to be from −0.20 atppm to 1.21 atppm. By setting the Δ value as such, optical absorption is reduced by suppressing generation of $Fe^{2+}$ (and $Fe^{4+}$) in the garnet single crystal including Gd and it is possible to set IL to be less than or equal to 0.05 dB in the wavelength of light from 1.3 μm to 1.6 μm. Also, by setting the Pt concentration to be less than or equal to the Mn or Group 2 element concentration, the steep increase of IL in the wavelength of light from 1.3 μm to 1.6 μm may be suppressed.

When the coefficient α is set to any value in the numerical range of 0.815±0.035 (that is, from 0.780 to 0.850), the Δ value may be set from −0.20 atppm to 1.21 atppm. In other words, the Bi-substituted rare earth iron garnet single crystal where the Δ value is set from −0.20 atppm to 1.21 atppm when the coefficient α is any one value in the numerical range of 0.815±0.035 is the Bi-substituted rare earth iron garnet single crystal according to the present invention. Also, in the Bi-substituted rare earth iron garnet single crystal having the Δ value from −0.20 atppm to 1.21 atppm, a most preferable Bi-substituted rare earth iron garnet single crystal is a Bi-substituted rare earth iron garnet single crystal that always has the Δ value from −0.20 atppm to 1.21 atppm even when the coefficient α is set to any value within the numerical range of 0.815±0.035 (that is, from 0.780 to 0.850).

More preferably, the Δ value is set to be 0 atppm. In other words, the Pt concentration and the Mn or Group 2 element concentration multiplied by the coefficient α is the same. By setting the Pt concentration and the Mn or Group 2 element concentration such that Δ value is 0 atppm, optical absorption is reduced by suppressing generation of $Fe^{2+}$ (and $Fe^{4+}$) in the garnet single crystal including Gd and it is possible to set IL to be a minimum value in the wavelength of light from 1.3 μm to 1.6 μm.

The Δ value may be set to be 0 atppm when the coefficient α is set to any value within the numerical range of 0.815±0.035 (that is, 0.780 to 0.850). In other words, the Bi-substituted rare earth iron garnet single crystal where the Δ value is set to 0 atppm when the coefficient α has any one value in the numerical range of 0.815±0.035 is the Bi-substituted rare earth iron garnet single crystal according to the present invention.

EXAMPLES 1 THROUGH 8

Hereinafter, embodiments of the garnet single crystal according to the present invention, which are manufactured according to the method are shown, but are not limited thereto. Table 1 shows each empirical formula, Mn concentration (atppm), Pt concentration (atppm), Δ value (atppm), and IL value (dB) in a center wavelength of 1.55 μm of a Gd-based garnet single crystal as an example of the garnet single crystal according to the present invention. Here, the coefficient α is unified to 0.815, and the third places of decimals of Δ values (atppm) are rounded off. Sample numbers are sequentially given from Examples 1 through 8 from the top in Table 1. Also, composition analysis, and Mn concentration and Pt concentration analysis of the manufactured garnet single crystals are performed via an ICP-MS analysis method.

TABLE 1

| Sample No. | Empirical Formula | Mn Concentration (atppm) | Pt Concentration (atppm) | Δ (atppm) | IL (dB) |
| --- | --- | --- | --- | --- | --- |
| Example 1 | $(GdHoBi)_3(FeGaAl)_5O_{12}$ | 6.42 | 2.10 | 3.13 | 0.097 |
| Example 2 | $(GdHoBi)_3(FeGaAl)_5O_{12}$ | 3.09 | 2.90 | −0.38 | 0.099 |
| Example 3 | $(GdHoBi)_3(FeGaAl)_5O_{12}$ | 3.28 | 2.88 | −0.21 | 0.053 |
| Example 4 | $(GdHoBi)_3(FeGaAl)_5O_{12}$ | 3.09 | 2.67 | −0.15 | 0.046 |
| Example 5 | $(GdHoBi)_3(FeGaAl)_5O_{12}$ | 3.46 | 1.54 | 1.28 | 0.052 |
| Example 6 | $(GdHoBi)_3(FeGaAl)_5O_{12}$ | 3.35 | 1.54 | 1.19 | 0.048 |
| Example 7 | $(GdHoBi)_3(FeGaAl)_5O_{12}$ | 2.18 | 1.77 | 0.01 | 0.032 |
| Example 8 | $(GdHoBi)_3(FeGaAl)_5O_{12}$ | 2.61 | 2.123 | 0.00 | 0.020 |
| Comparative Example 1 | $(GdHoBi)_3(FeGaAl)_5O_{12}$ | 2.55 | 2.58 | −0.50 | 0.171 |
| Comparative Example 2 | $(GdHoBi)_3(FeGaAl)_5O_{12}$ | 6.72 | 2.05 | 3.43 | 0.124 |

Based on the results of Examples 1 through 3 and 5, it was checked that it is possible to set IL to be less than or equal to 0.10 dB by setting the Δ value to be 3.13 atppm, −0.38 atppm, −0.21 atppm, and 1.28 atppm, which are within a range from −0.40 atppm to 3.18 atppm.

Also, based on the results of Examples 4 and 6, it was checked that it is possible to set the IL to be less than or equal to 0.05 dB by setting the Δ value to be −0.15 atppm and 1.19 atppm, which are within a range from −0.20 atppm to 1.21 atppm.

Also, in 0.01 atppm (Example 7) where the Δ value is close to 0 atppm, it was checked that the IL value is decreased more than Examples 1 through 6, while it was checked that Example 8 where Δ value is set to 0.00 atppm is most preferable compared to Examples 1 through 7 as the IL value is a minimum of 0.020 dB.

Also, when the Δ values are again calculated by setting the coefficient α to be 0.850 in Example 1 and to be 0.780 in Example 2, the Δ values respectively become 3.36 atppm and −0.49 atppm, and thus are outside a range from −0.40 atppm to 3.18 atppm. However, since the Δ values are within the range when the coefficient α is 0.815, Examples 1 and 2 are embodiments according to the present invention. Also, when the Δ values are again calculated by setting the coefficient α to be 0.780 in Example 3 and to be 0.850 in Example 5, the Δ values respectively become −0.32 atppm and 1.40 atppm. Accordingly, in Examples 3 and 5, the Δ values are always set from −0.40 atppm to 3.18 atppm even when the coefficient α is set to any value within the range of 0.815±0.035 (that is, 0.780 to 0.850). Thus, it is concluded that Examples 3 and 5 are more preferable than Examples 1 and 2.

Also, when the Δ values are again calculated by setting the coefficient α to be 0.780 in Example 4 and to be 0.850 in Example 6, the Δ values respectively become −0.26 atppm and 1.31 atppm, and thus are outside a range from −0.20 atppm to 1.21 atppm. However, since the Δ values are within the range when the coefficient α is 0.815, Examples 4 and 6 are embodiments according to the present invention. Also, when the Δ value is again calculated by setting the coefficient α to be from 0.780 to 0.850 in Example 7, the Δ value is from −0.07 atppm to 0.08 atppm. Accordingly, in Example 7, the Δ value is always set from −0.20 atppm to 1.21 atppm even when the coefficient α is set to any value within the range of 0.815±0.035 (that is, 0.780 to 0.850). Thus, it is concluded that Example 7 is more preferable than Examples 4 and 6.

COMPARATIVE EXAMPLES 1 AND 2

Garnet single crystals of Comparative Examples 1 and 2 were manufactured under the same conditions as Examples 1 through 8, except that Δ values are changed by changing Mn concentration and Pt concentration in the garnet single crystals. Also, the manufactured garnet single crystals were evaluated like Examples 1 through 8. The Mn concentration and the Pt concentration are set such that the Δ value is less than −0.40 atppm in Comparative Example 1 and is more than 3.18 atppm in is Comparative Example 2.

It was checked, by Comparative Example 1, that the IL value is higher than 0.10 dB when the Δ value is −0.50 atppm, i.e., lower than −0.40 atppm.

Also, it was checked, by Comparative Example 2, that the IL value is higher than 0.10 dB when Δ value is 3.43 atppm, i.e., higher than 3.18 atppm.

Also, when the Δ value is again calculated by setting the coefficient α from 0.780 to 0.850 in Comparative Example 1, the Δ value becomes from −0.59 atppm to −0.41 atppm, and thus is outside a range from −0.40 atppm to 3.18 atppm. In other words, it is concluded that Comparative Example 1 does not follow the present invention since the Δ value is always outside the range from −0.40 atppm to 3.18 atppm even when the coefficient α is set to any value in the range of 0.815±0.035 (that is, 0.780 to 0.850) in Comparative Example 1.

Similarly, when the Δ value is again calculated by setting the coefficient α from 0.780 to 0.850 in Comparative Example 2, the Δ value becomes from 3.19 atppm to 3.66 atppm, and thus is outside a range from −0.40 atppm to 3.18 atppm. Accordingly, it is concluded that Comparative Example 2 does not follow the present invention.

Also, setting of the M concentration in the garnet single crystal may be changed by changing an input amount of M material powder to the crucible. A ratio of M contained in the garnet single crystal grown from the amount input to the crucible has a constant value. Accordingly, by controlling the input amount to the crucible according to the ratio, the M concentration may be within a desired range.

In order to set the Pt concentration in the garnet single crystal to a desired range, oxygen concentration of the growth atmosphere may be controlled.

An optical device of any one of an optical isolator, an optical circulator, an optical attenuator, a Faraday mirror, a current sensor, a magnetic field sensor, and a magnetic optical switch manufactured by including the garnet single crystal does not adversely affect the environment since the garnet single crystal included in the optical device does not include lead.

The invention claimed is:

1. A Bi-substituted rare earth iron garnet single crystal which has a composition of $R_{3-x}Bi_xFe_{5-w}A_wO_{12}$, wherein R denotes only Gd or Gd and one or more rare earth elements selected from the group consisting of Y, Eu, Ho, Yb, Lu, Nd, Tm, La, Sm, Dy, Er, Ce, and Pr, A denotes one or more elements selected from the group consisting of Ga, Al, In, Sc, Co, Ni, Cr, V, Ti, Si, Ge, Mg, Zn, Nb, Ta, Sn, Zr, Hf, Pt, Rh, Te, Os, Ce, and Lu, $0.7 < x \leq 1.5$, and $0 < w \leq 1.5$, does not contain Pb and contains Pt, and the Bi-substituted rare earth iron garnet single crystal additionally contains Mn or at least one Group 2 element, wherein, when M denotes Mn or at least one Group 2 element, [M] denotes M concentration (atppm) and [Pt] denotes Pt concentration (atppm) in the Bi-substituted rare earth iron garnet single crystal, and a relational expression Δ of [M] and [Pt] is represented by Equation 1 below:

$$\Delta = (\alpha \times [M]) - [Pt],$$ [Equation 1]

wherein a coefficient α is set to any value within a numerical range of 0.815±0.035 and Δ is set from −0.40 atppm to 3.18 atppm.

2. The Bi-substituted rare earth iron garnet single crystal of claim 1, wherein Δ is set from −0.20 atppm to 1.21 atppm.

3. The Bi-substituted rare earth iron garnet single crystal of claim 1, wherein Δ is set to 0 atppm.

4. Any one of an optical isolator, an optical circulator, an optical attenuator, a Faraday mirror, a current sensor, a magnetic field sensor, and a magnetic optical switch comprising the Bi-substituted rare earth iron garnet single crystal of claim 1.

5. A method of manufacturing a Bi-substituted rare earth iron garnet single crystal, the method comprising:

putting a solvent which does include at least $Bi_2O_3$, and does not include a lead compound into a crucible formed of a Pt material;

putting a solute comprising $Fe_2O_3$, $Gd_2O_3$, and another compound aside from $Fe_2O_3$ and $Gd_2O_3$ into the crucible;

putting a mixture of any one of MO, $MO_2$, and $M_2O_3$, wherein M denotes Mn or at least one Group 2 element, into the solvent; and growing a Bi-substituted rare earth iron garnet single crystal on a nonmagnetic garnet crystal substrate, wherein, in the Bi-substituted rare earth iron garnet single crystal, when [M] denotes M concentration (atppm) and [Pt] denotes Pt concentration (atppm) in the Bi-substituted rare earth iron garnet single crystal, and a relational expression Δ of [M] and [Pt] is represented by Equation 2 below:

$$\Delta = (\alpha \times [M]) - [Pt], \quad \text{[Equation 2]}$$

wherein a coefficient α is set to any value within a numerical range of 0.815±0.035 and Δ is set from −0.40 atppm to 3.18 atppm.

6. The method of claim 5, wherein Δ is set from −0.20 atppm to 1.21 atppm.

7. The method of claim 5, wherein Δ is set to 0 atppm.

8. The method of claim 5, wherein the Bi-substituted rare earth iron garnet single crystal is grown under an inert gas atmosphere.

* * * * *